(12) United States Patent
Yi et al.

(10) Patent No.: US 6,809,572 B2
(45) Date of Patent: Oct. 26, 2004

(54) INTEGRATED CIRCUIT WITH AUTOMATIC POLARITY DETECTION AND CONFIGURATION

(75) Inventors: Heling Yi, Austin, TX (US); David Olivenbaum, Austin, TX (US)

(73) Assignee: Cirrus Logic, Incorporated, Austin, TX (US)

( * ) Notice: Subject to any disclaimer, the term of this patent is extended or adjusted under 35 U.S.C. 154(b) by 140 days.

(21) Appl. No.: 10/245,957

(22) Filed: Sep. 18, 2002

(65) Prior Publication Data

US 2004/0051516 A1 Mar. 18, 2004

(51) Int. Cl.[7] ............................................... H03K 17/16
(52) U.S. Cl. ...................................................... 327/388
(58) Field of Search .................................. 327/379, 387, 327/388, 365, 403–408, 415–418, 518, 530, 545, 549, 551, 564, 565, 594, 334, 363; 324/133; 381/120–121; 330/10

(56) References Cited

U.S. PATENT DOCUMENTS

2001/0013808 A1   8/2001   Fujisawa

FOREIGN PATENT DOCUMENTS

| JP | 05274787 | 10/1993 |
| JP | 07177030 | 7/1995 |
| JP | 2001127569 | 5/2001 |

*Primary Examiner*—Evan Pert
(74) *Attorney, Agent, or Firm*—Swanson & Bratschun, LLC

(57) ABSTRACT

An integrated circuit on a system board is used, for example, in a digital audio device (such as a DVD or A/V receiver). The integrated circuit includes a digital-to-analog converter and the system board may include circuitry to mute the analog output of the device under certain predefined conditions. Because it may not be known in advance by the designer of the integrated circuit whether the circuit is activated by a signal in a high state (polarity) or a low state, the integrated circuit includes a detector which detects and stores the required polarity. When it is necessary for the circuit to be activated, the detector provides a signal of the correct polarity.

23 Claims, 5 Drawing Sheets

INTEGRATED CIRCUIT WITH AUTOMATIC POLARITY DETECTION AND CONFIGURATION

TECHNICAL FIELD

The present invention relates generally to the field of integrated circuits and, in particular, to detecting and configuring the required polarity of a circuit pin.

BACKGROUND ART

An integrated circuit or "chip" is generally installed or mounted on a system board which is ultimately installed in an end product. Commonly, an integrated circuit may be purchased for use in several (or many) different end products, often by different manufacturers. It will be appreciated that it may be impractical to use separate chip designs for similar applications. However, in the past, it has also been impractical to automatically modify chips so as to function with a variety of different system boards.

For example, audio devices such as DVD units and audio/video (A/V) receivers include a digital audio integrated circuit having, among other functional components, a digital-to-analog converter (DAC) for outputting an analog audio reproduction of a digital signal. The integrated circuit is mounted on a system board which generally includes a mute circuit to disable the analog audio output during unit power-on, reset or other predetermined events. Absent such mute, the listener would hear clicks and pops which are both distracting to the listener and potentially damaging to the audio device or speakers. And, even if only 0s are input into the DAC in an attempt to reduce the noise, clicks and pops may still be generated downstream from the DAC, especially as there may be some brief, but finite, time delay after the 0s begin to be input to the DAC.

FIGS. 1A–1D are examples of mute circuits commonly used on system boards. The circuits of FIGS. 1A and 1C are activated when the mute signal (actually the inverted mute signal) to the "mute node" is in a low state, driving the mute node to ground; these circuits are said to have an "active low mute". In contrast, the circuits of FIGS. 1B and 1D have an active high mute and are activated when the control signal to the mute node is in a high state.

The mute circuit is activated by mute driver circuitry on the audio chip which, in turn, is enabled by a mute_control signal 202. FIG. 2 is an illustration of a typical prior art mute driver circuit 200. As will be understood, when the mute_control signal 202 is in a low state, transistor M0 is off and M1 is on, driving the mute node 204 high. And, when the mute_control signal 202 is in the high state, transistor M0 is on and M1 is off, driving the mute node 204 low. Depending upon whether the particular mute circuit on the system board is active high or active low, the signal to the mute node 204 must either be high or low. Consequently, the designer of the audio chip must either know in advance with which type of mute circuit the chip will be used and make available the appropriate chip or the system board designer must decide in advance which chip will be used and conform the mute circuit to the chip (and then be limited as to second or future sources of the chip). Alternatively, the chip may be designed with configurable polarity. However, configurable polarity requires either an extra and dedicated pin or a register which can be set through a control port whenever the chip goes through a power-on or reset. One disadvantage to using a register is that there may still be a delay after the chip exits the reset state until the register is configured. During this time the mute node may be in the unmute state, resulting in the undesirable clicks and pops which were to be eliminated.

Consequently, there remains a need for an integrated circuit having an inexpensive and efficient method for detecting the type of circuitry to which it is connected and having the ability to automatically configure itself with the appropriate polarity.

SUMMARY OF THE INVENTION

The present invention provides an integrated circuit mountable on a system board used, for example, in a digital audio device (such as a DVD or A/V receiver). The integrated circuit includes a digital-to-analog converter, possibly in conjunction with a CODEC, and the system board may include circuitry to, for example, mute the analog output of the device under certain predefined conditions. Because it may not be known in advance by the designer of the integrated circuit whether the circuit is activated by a signal in a high state (polarity) or a low state, the integrated circuit further includes a detector which detects and stores the required polarity (although it will be appreciated that certain of the components of the detector may also be placed off-chip). When it is necessary for the circuit to be activated, the detector provides a signal of the correct polarity.

DETAILED DESCRIPTION OF THE PREFERRED EMBODIMENT

Figure 1A:
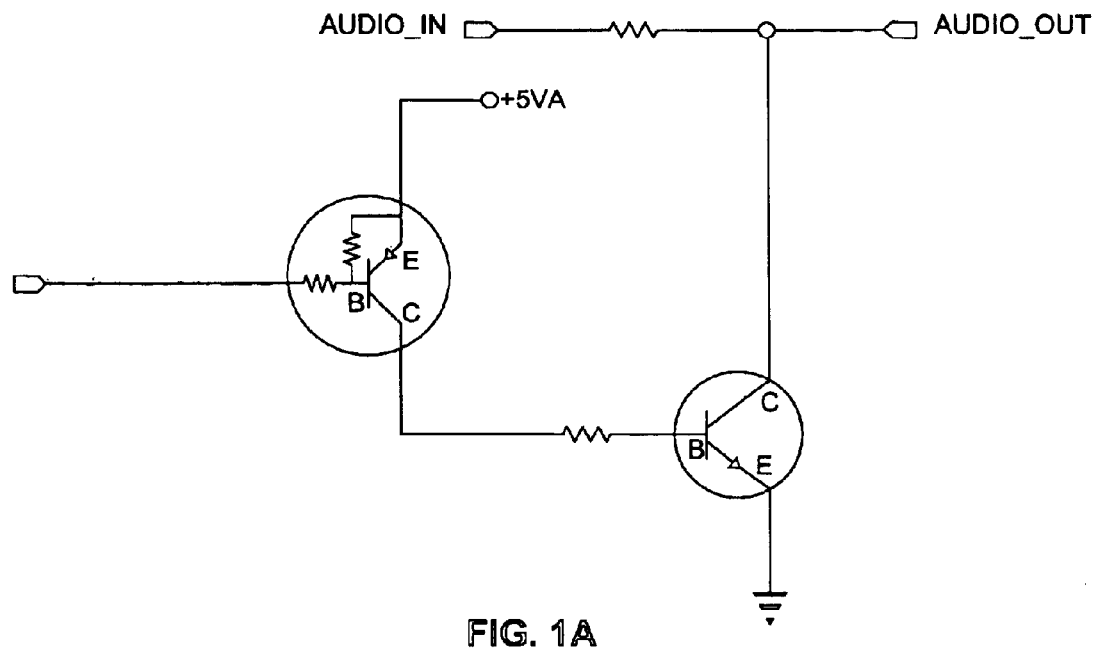
FIGS. 1A–1D are examples of mute circuits commonly used on system boards.
Figure 1B:
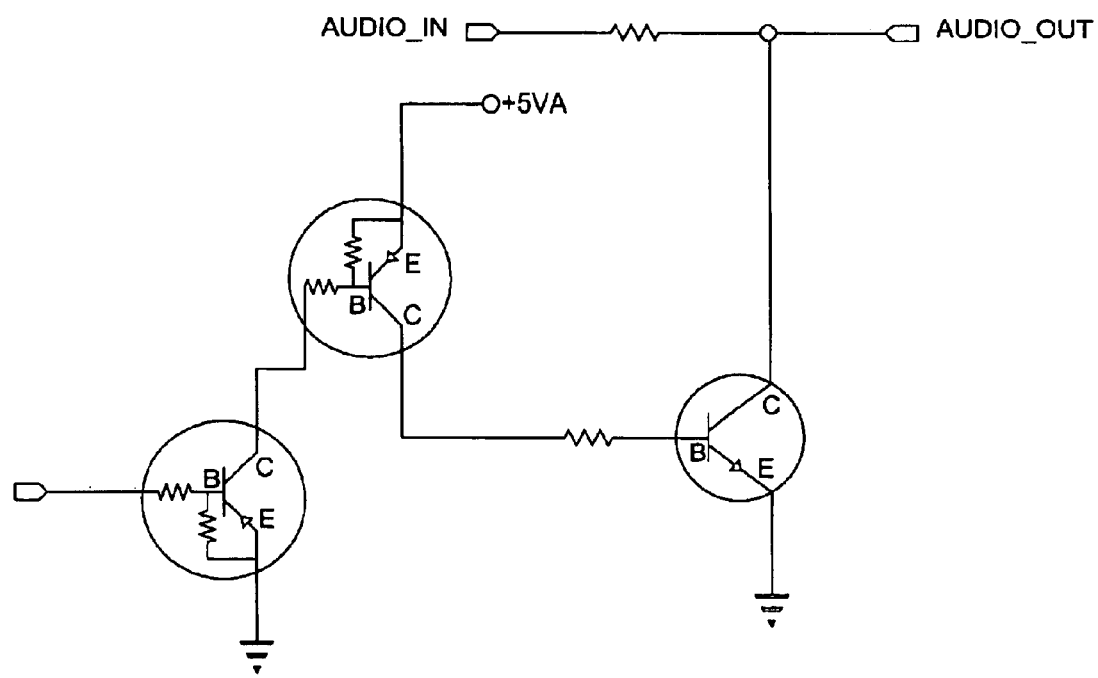
Figure 1C:
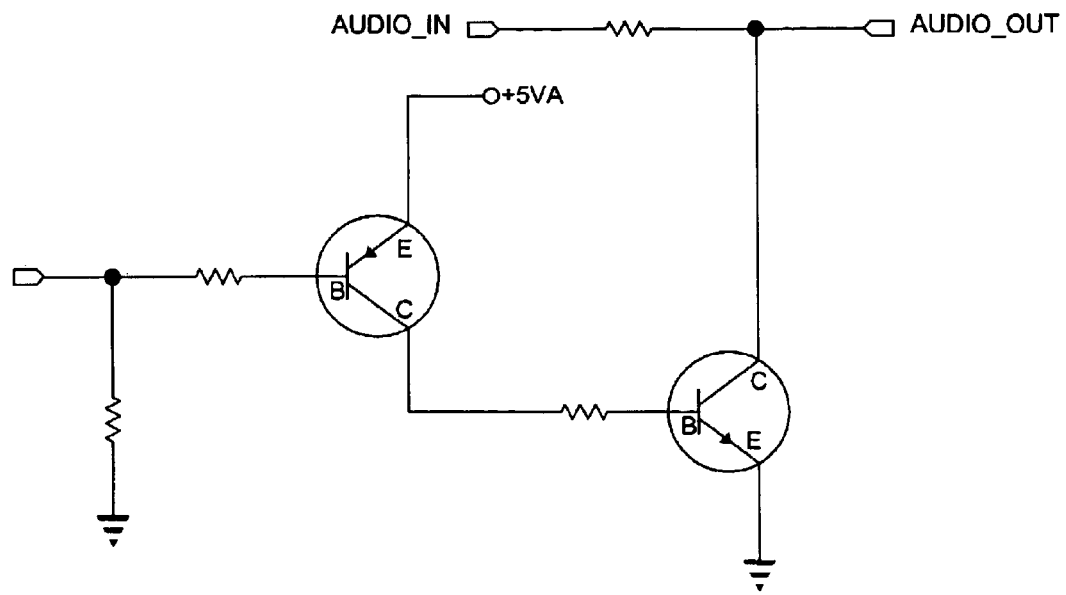
Figure 1D:
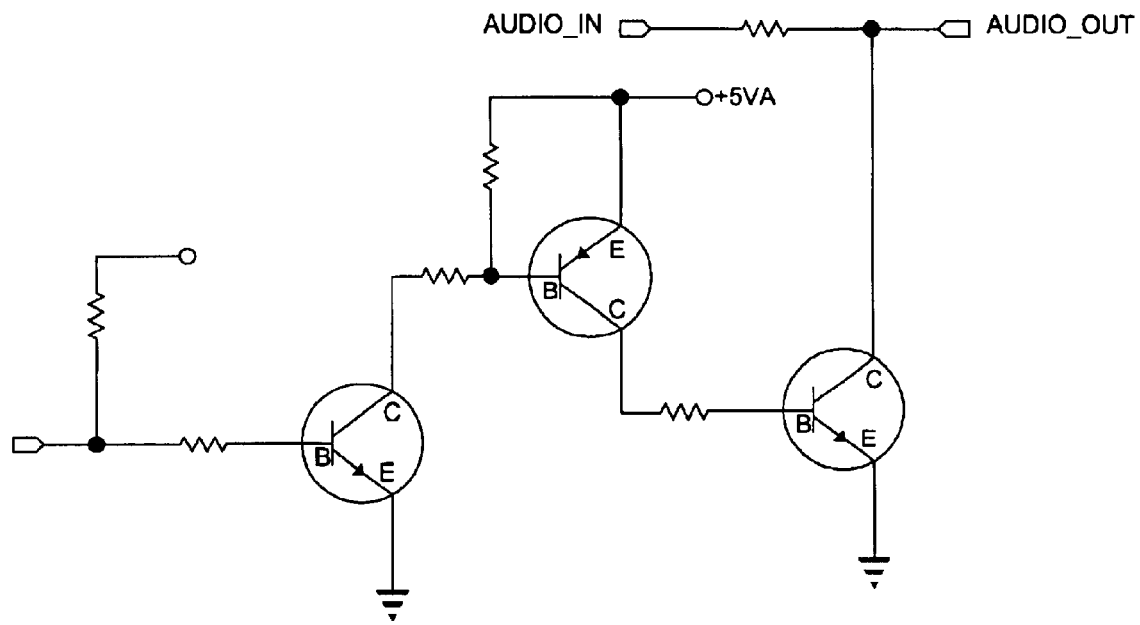
Figure 2:
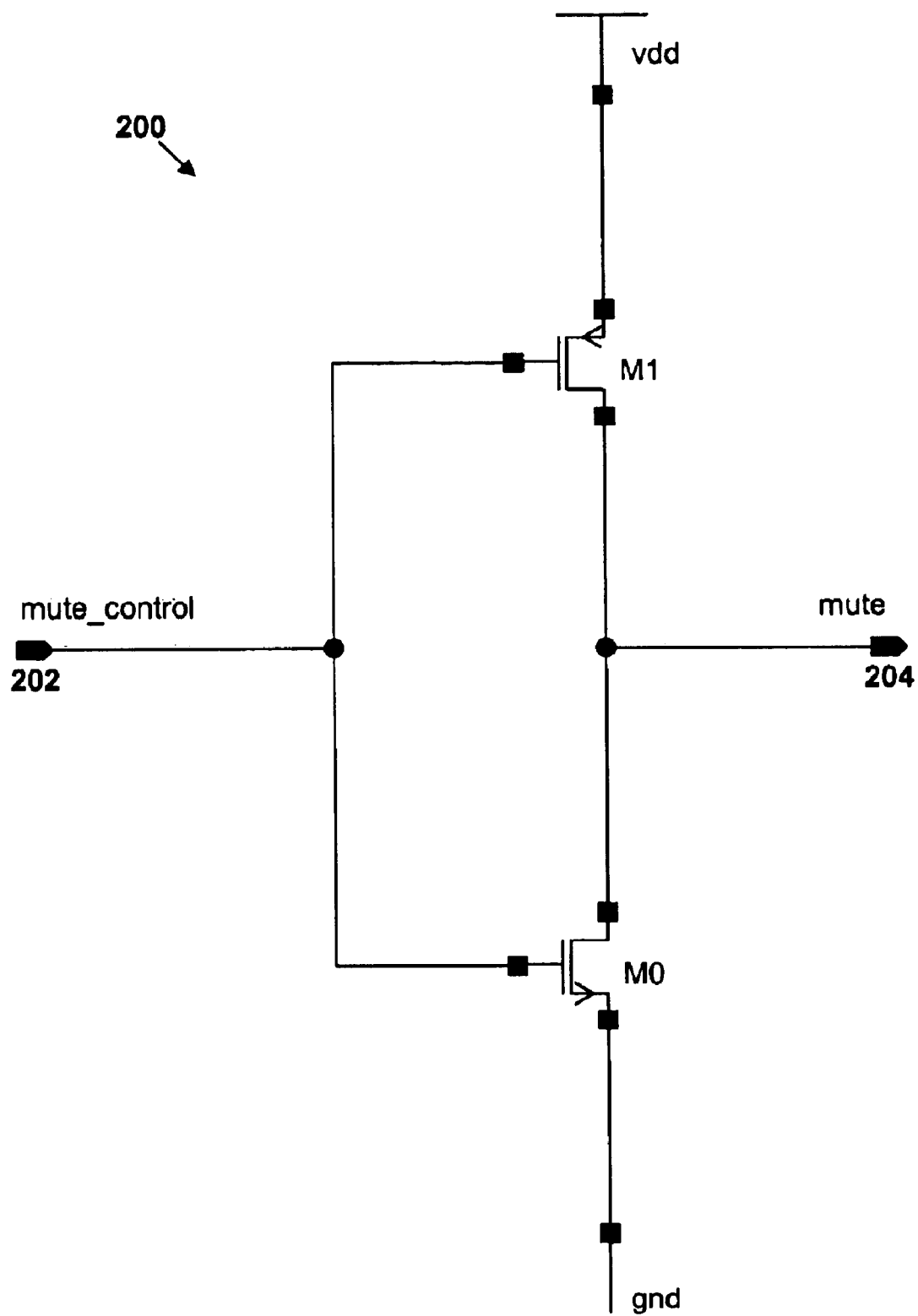
FIG. 2 is a prior art mute circuit driver.
Figure 3:
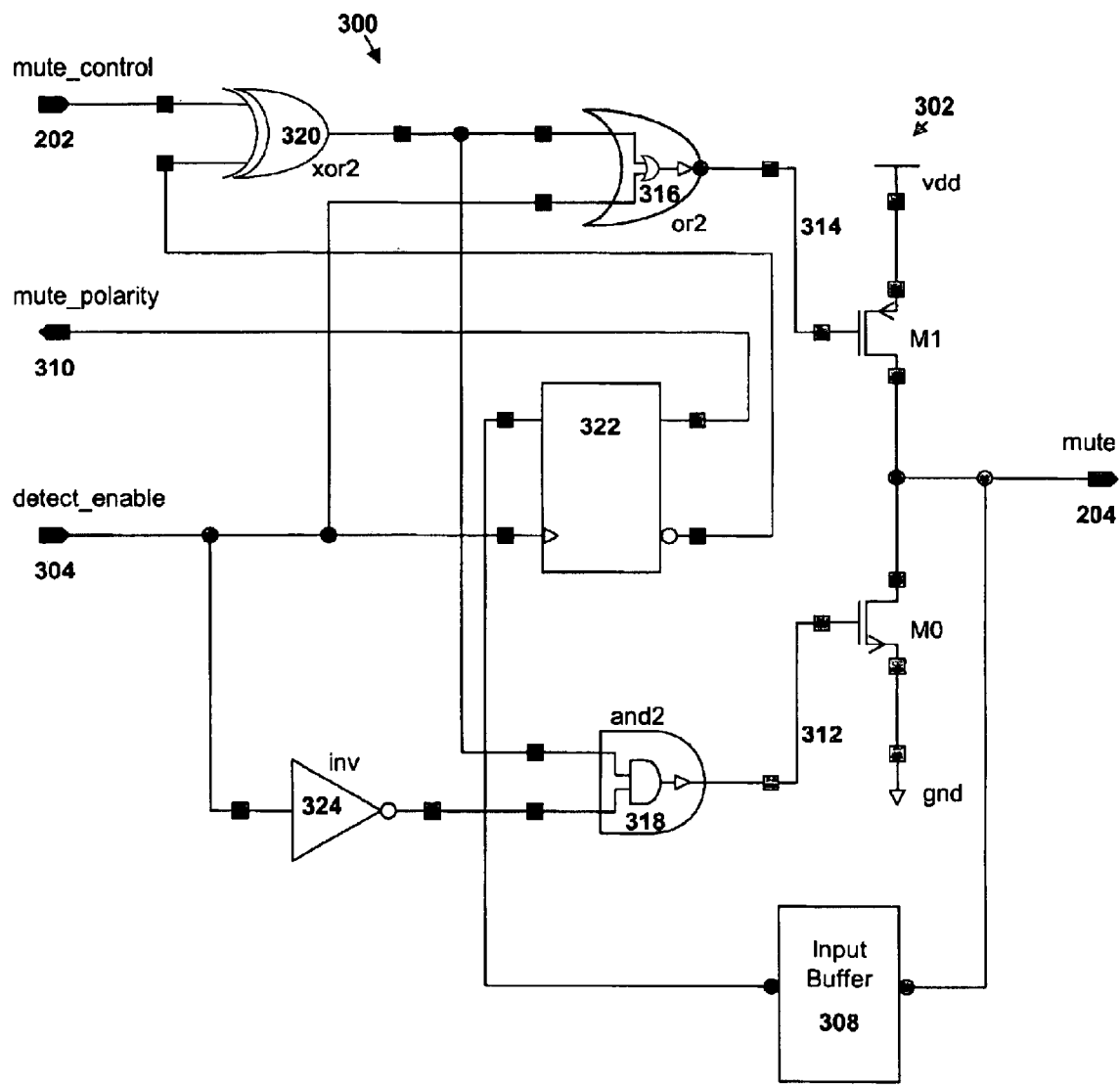
FIG. 3 is a logic diagram of the present invention incorporated in a mute polarity detector.

FIG. 3 is a high level logic diagram of a polarity detector 300 of the present invention included in an exemplary integrated circuit which also includes a DAC. The chip is mountable on a system board having, for example, a mute circuit, preferably of the type illustrated in FIG. 1C or 1D (if a circuit of FIG. 1A or 1B are used and the input line is left floating, either circuit will self-bias to an undesirable un-muted state). The invention is described herein as being employed in conjunction with a mute circuit and mute node; however, such description should not be deemed as limiting and it will be understood that the invention may be used in conjunction with other types of circuits in which the polarity of a node is not known in advance but is determined at power-up or other type of reset. A driver circuit 302 is also included on the chip and is similar to the driver circuit illustrated in FIG. 2. However, rather than the control gates of both switches (such as transistors M0 and M1) being tied to a mute_control signal node as in the prior art of FIG. 2, they are coupled to separate outputs of the detector 300. Inputs to the detector 300 include the mute_control signal 202, a detect_enable signal 304 and a mute_node_status 306 coupled to the mute node 204 (preferably through a buffer 308). Outputs include a mute_polarity signal 310 and signals 312 and 314 to the control gates of the switches M0 and M1, respectively. Optionally, a pull-up resistor 326, or its functional equivalent, may be coupled to the mute node 204 such that, if the mute node 204 is disconnected from the mute circuitry, the resistor 326 will prevent the mute node 204 from floating. It will be appreciated that a pull-down resistor may be used instead of the pull-up resistor 326.

The detector 300 includes an OR gate 316, an AND gate 318, an XOR gate 320, a latch 322 and an inverter 324. It will be appreciated, of course, that any of these logic devices may be replaced by a functional equivalent. The mute_control signal 202 is coupled to an input to the XOR gate 320, the detect_enable signal 304 is inverted by the inverter 324 and coupled to an input to the AND gate 318 (alternatively, an inverted detect_enable signal may be generated elsewhere in the chip). The detect_enable signal 304 is also coupled to a clock input to the latch 322 and to an input to the OR gate 316. The outputs from the AND gate 318 and the OR gate 316 are coupled to the control gates of the switches M0 and M1, respectively. The mute_node_status 306 is coupled to the input to the latch 322. The mute_polarity signal 310 is coupled to the output of the latch 322. The inverted output of the latch 322 is coupled to a second input to the XOR gate 320 whose output is coupled to a second input to the OR gate 316 and to a second input of the AND gate 318.

In operation, when the chip is powered-on or undergoes a reset, the mute_detect signal 304 is asserted (goes to a high state), enabling the latch 322. Simultaneously, the output of the OR gate 316 goes high and the output of the AND gate 318 goes low. The switches M0 and M1 thus both turn off, thereby preventing the mute node 204 from being pulled high or low and effectively isolating the mute node 204 from any of the control signals from the detector circuit 300. Consequently, the polarity (or state) of the mute node 204 is determined only by the mute circuitry on the system board and this polarity is detected by the latch 322. After the reset is complete, the mute_enable signal 304 is deasserted and the mute polarity is retained in the latch 322.

Subsequently, when the mute_control signal 202 is asserted, the output of the XOR gate 320 will be high if the mute polarity was high and will be low if the mute polarity was low. The mute node 204 will thus be pulled high or low as required to properly activate the mute circuitry.

Figure 4:
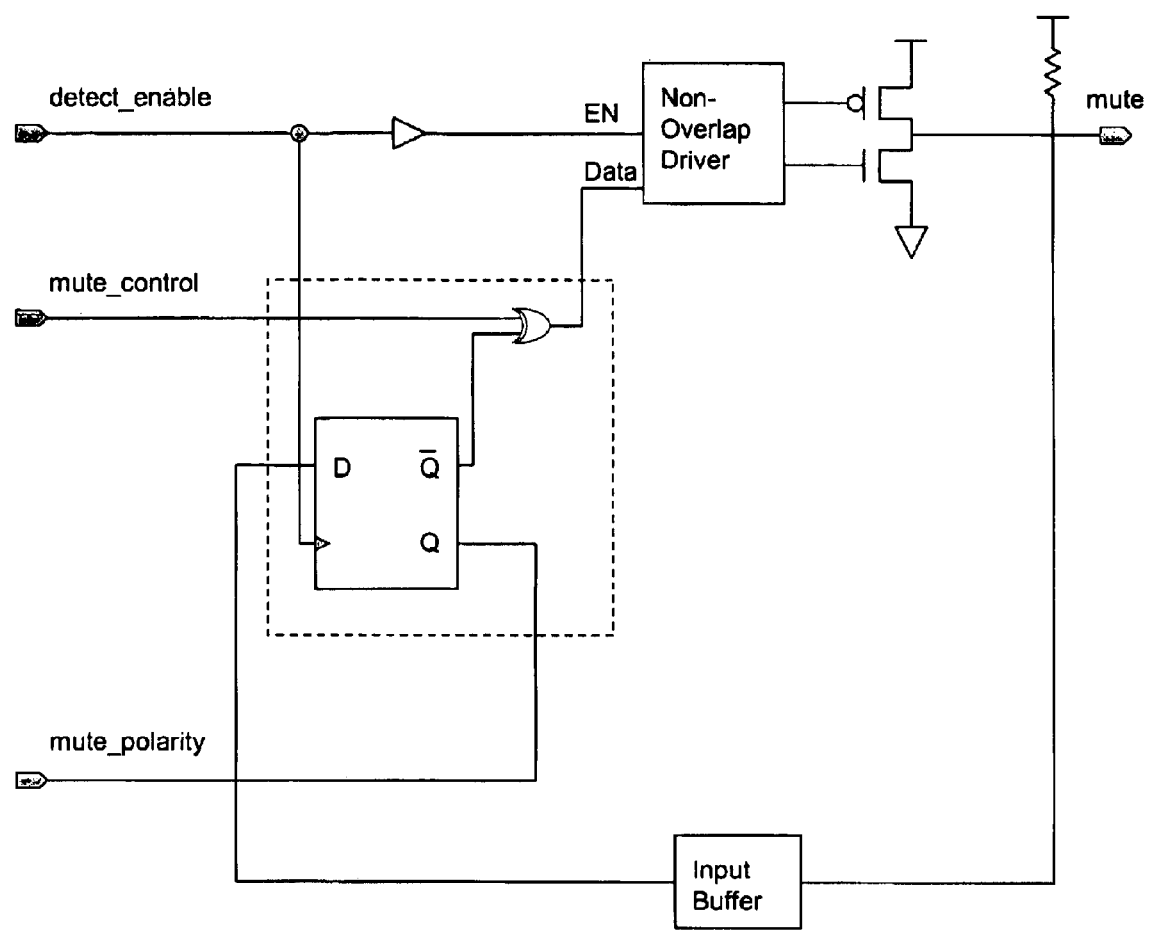
FIG. 4 is a logic diagram an alternative embodiment of a mute polarity detector of the present invention.

FIG. 4 is a logic diagram an alternative embodiment of a polarity detector 400 of the present invention, also used to configure as a mute node. The detector 400 includes an XOR gate 402 and a latch 404. The detect_enable signal 304 is inverted by an inverter 406 and also coupled to an input to the detect_enable signal 304. The mute_node_status 306 is coupled to the input to the latch 404. The mute_polarity signal 310 is coupled to the output of the latch 404. The mute_control signal 202 is coupled to an input to the XOR gate 402. The output of the inverter 406 is coupled to the enable input of a non-overlap driver 408 (which prevents both transistors of the mute driver circuit 302 from being on simultaneously). The inverted output of the latch 404 is coupled to the other input of the XOR gate 402 and the output of the XOR gate 402 is coupled to the data input of the driver 408. The outputs of the driver 408 are coupled to inputs of the mute driver circuit 302 and the output of the mute driver circuit 302 is the mute node 204. A pull-up resistor 326 (or its functional equivalent) is coupled to the mute node 204 to prevent the mute node 204 from floating in the event mute circuitry is not connected to the mute node 204.

In operation, when the detect_enable signal 304 is asserted, the outputs of the non-overlap driver 408 are disabled and, as in the previous embodiment, the input to the latch 404 receives the logic level of the mute node 204. This level is latched into the latch 404. When the detect_enable signal 304 is deasserted and the mute_control signal 202 is asserted, the inverted mute level (from the inverted output of the latch 404) is XORed with the mute_control signal 202 and the output is input to the non-overlap driver 408 to provide the correct polarity to the mute node 204.

The objects of the invention have been fully realized through the embodiments disclosed herein. Those skilled in the art will appreciate that the various aspects of the invention may be achieved through different embodiments without departing from the essential function of the invention. For example, one or more of the elements of the detector of the present invention may be placed "off-chip". The invention may also be incorporated with other types of integrated circuits and other off-chip circuitry in order to control the output of the integrated circuit where the polarity is determined at power-up or other type of reset. And, it will be appreciated that functional equivalents may be used in place of any of the elements of the invention. The particular embodiments are illustrative and not meant to limit the scope of the invention as set forth in the following claims.

What is claimed is:

1. An automatic node polarity detector for use in conjunction with a circuit, the circuit having a node and being activated when the node is in a predetermined state which is not known after a reset, the detector comprising:
    means for detecting the state of the node after a reset; and
    means, responsive to said means for detecting, for driving the node with the proper signal polarity.

2. The polarity detector of claim 1, wherein said means for driving the node comprises means for enabling the node with the proper signal polarity when a control signal is in an asserted state.

3. The polarity detector of claim 1, wherein said means for detecting the state of the node comprises:
    means for preventing the node from receiving an input signal when a detect_enable signal is in an asserted state;
    a first logic gate having an output in a low state when an inverted detect_enable signal is in a deasserted state and input to a first of two inputs;
    a second logic gate having an output in a high state when the detect_enable signal is in the asserted state and input to a first of two inputs; and
    a latch having an input coupled to the node whereby, when the detect_enable is in the asserted state, said latch stores the state of the node.

4. The polarity detector of claim 3, wherein said means for enabling the node comprises:
    a third logic gate having an output, said output being in a high state when a control signal is in the asserted state and an inverted output from said latch is in a deasserted state and said output being in a low state when the control signal is in a deasserted state and the inverted output from said latch is in a low state, said third logic gate output being coupled to:
        a second input of said first logic gate; and
        a second input of said second logic gate;
    whereby, said output of said third logic gate enables the node with the proper signal polarity when the control signal is in the asserted state.

5. The polarity detector of claim 1, wherein the circuit is a mute circuit, the node is a mute node and the control signal is a mute_control signal.

6. An automatic polarity detector for use in conjunction with a circuit on a system board, the circuit having a node and being activated when the node is in a predetermined state which is not known upon reset, the detector comprising:

means for receiving a detect_enable signal;
means for detecting the state of the node when the detect_enable signal is in an asserted state;
means for receiving a control signal; and
means for enabling the node with the proper signal polarity when the control signal is in an asserted state.

7. The polarity detector of claim 6, wherein the circuit is a mute circuit, the node is a mute node and the control signal is a mute_control signal.

8. The polarity detector of claim 7, wherein said means for detecting the state of the mute node comprises:
means for preventing the mute node from receiving an input signal when the detect_enable signal is in the asserted state;
a first logic gate having an output in a low state when an inverted detect_enable signal is in a deasserted state and input to a first of two inputs;
a second logic gate having an output in a high state when the detect_enable signal is in the asserted state and input to a first of two inputs; and
a latch having an input coupled to the mute node whereby, when the detect_enable is in the asserted state, said latch stores the state of the mute node.

9. The polarity detector of claim 8, said means for enabling the mute node comprising:
a third logic gate having an output, said output being in a high state when the mute_control signal is in the asserted state and an inverted output from said latch is in a deasserted state and said output being in a low state when the mute_control signal is in a deasserted state and the inverted output from said latch is in a low state, said third logic gate output being coupled to:
a second input of said first logic gate; and
a second input of said second logic gate;
whereby, said output of said third logic gate enables the mute node with the proper signal polarity when the mute_control signal is in the asserted state.

10. The polarity detector of claim 7, said means detecting the state of the mute node comprising:
means for preventing the mute node from receiving an input signal when the detect_enable signal is in the asserted state;
a latch having an input coupled to the mute node whereby, when the detect_enable is in the asserted state, said latch stores the state of the mute node; and
a logic gate comprising:
a first input coupled to receive an inverted output from said latch;
a second input coupled to receive the detect_enable signal; and
an output which is in a high state when the first input and the second input are in the same state and is in a low state when the first input and the second input are in opposite states;
said inverted latch output and said logic gate output being coupled to respective first and second inputs of a mute driver circuit whereby an output of the mute driver circuit enables the mute node with the proper signal polarity when the mute_control signal is in the asserted state.

11. The polarity detector of claim 10, wherein said inverted latch output and said logic gate output are coupled to the respective first and second inputs of the mute driver circuit through a non-overlap driver circuit.

12. An automatic mute polarity detector for an integrated circuit to be mounted on a system board having a mute circuit with a mute node, the mute circuit being activated when the mute node is in a predetermined state which is not known in advance, the detector comprising:
first and second switches for:
driving the mute node to a low state when said first switch is off and said second switch is on;
driving the mute node to a high state when said first switch is on and said second switch is off; and
isolating the mute node from the mute polarity detector when both said first switch and said second switch are in an off state in response to a detect_enable signal being in an asserted state;
an OR gate having a first input coupled to receive the detect_enable signal and an output coupled to control said first switch;
an AND gate having a first input coupled to receive an inverted detect_enable signal and an output coupled to control said second switch, whereby, when the detect_enable signal is in the asserted state, said first and said second switches are in the off state;
a latch having a first input coupled to the mute node and a second input coupled to receive the detect_enable signal, whereby, when the detect_enable signal is in the asserted state, said latch detects and retains the polarity of the mute node and, when the detect_enable signal is in a deasserted state, said latch provides the polarity of the mute node at an output; and
an XOR gate having:
a first input coupled to receive a mute_control signal;
a second input coupled to receive an inverted output from said latch; and
an output coupled to a second input of said OR gate and to a second input of said AND gate;
whereby, when the mute_control signal is in the asserted state:
said first switch turns on and said second switch turns off if the signal at the output of said latch is in a high state; and
said first switch turns off and said second switch turns on if the signal at the output of said latch is in a low state.

13. A method for activating a circuit on a system board, the circuit being activated when a node is in a predetermined state which is not known after a reset, the method comprising the steps of:
means for detecting the state of the node after a reset; and
means, responsive to said means for detecting, for driving the node with the proper signal polarity.

14. The method of claim 13, wherein said detecting step comprises:
preventing the node from receiving an input signal when a detect_enable signal is in an asserted state;
inputting an inverted detect_enable signal to a first input of a first logic gate and outputting a signal in a low state from the first logic gate;
inputting the detect_enable signal to a first input of a second logic gate and outputting a signal in a high state from the second logic gate;
inputting the detect_enable signal to a first input of a latch;
inputting the state of the node to a second input of the latch; and
storing the state of the node in the latch.

15. The method of claim 13, wherein said enabling step comprises:

outputting a signal from a third logic gate in a high state when a control signal is in an asserted state and an inverted output from the latch is in a low state and outputting the signal from a third logic gate in a low state when the control signal is in a deasserted state and the inverted output from the latch is in a high state; and outputting the signal from the third logic gate to a second input of the first logic gate and to a second input of the second logic gate, whereby the output of the third logic gate enables the node with the proper signal polarity when the control signal is in the asserted state.

16. The method of claim 13, wherein said step of detecting the state of the node comprises:

preventing the node from receiving an input signal when a detect_enable signal is in an asserted state;

storing the state of the node in a latch when the detect_enable is in the asserted state;

generating a logic gate output which is:
in a high state when an inverted output from the latch and the detect_enable signal are in the same state; and
in a low state when the inverted output from the latch and the detect_enable signal are in opposite states;

coupling the inverted latch output and the logic gate output being coupled to respective first and second inputs of a driver circuit; and generating an output from the mute driver circuit to enable the node with the proper signal polarity when the control signal is in the asserted state.

17. The method of claim 16, further comprising the step of coupling the inverted latch output and the logic gate output to the respective first and second inputs of the mute driver circuit through a non-overlap driver circuit.

18. The method of claim 13, wherein the circuit is a mute circuit, the node is a mute node and the control signal is a mute_control signal.

19. An integrated circuit having an analog audio output and mountable on a system board having a mute circuit, the mute circuit having a mute node which, when enabled by a signal having a polarity which is unknown in advance, activates the mute circuit, the integrated circuit comprising:

means for receiving a detect_enable signal;

means for detecting the state of the mute node when the detect_enable signal is in an asserted state;

means for receiving a mute_control signal; and means for enabling the mute node with the proper signal polarity when the mute_control signal is in an asserted state.

20. The integrated circuit of claim 19, said means for detecting the state of the mute node comprising:

means for preventing the mute node from receiving an input signal when the detect_enable signal is in the asserted state;

a first logic gate having an output in a low state when an inverted detect_enable signal is in a deasserted state and input to a first of two inputs of said first logic gate;

a second logic gate having an output in a high state when the detect_enable signal is in the asserted state and input to a first of two inputs of said second logic gate; and a latch having an input coupled to the mute node whereby said latch stores the state of the mute node when the detect_enable is in the asserted state.

21. The integrated circuit of claim 20, said means for enabling the mute node comprising:

a third logic gate having an output, said output being in a high state when the mute_control signal is in the asserted state and an inverted output from said latch is in a low state and said output being in a low state when the mute_control signal is in a deasserted state and the inverted output from said latch is in a low state, said output of said third logic gate being coupled to a second input of said first logic gate and a second input of said second logic gate;

whereby said output of said third logic gate enables the mute node with the proper signal polarity when the mute_control signal is in the asserted state.

22. The integrated circuit of claim 19, said means detecting the state of the mute node comprising:

means for preventing the mute node from receiving an input signal when the detect_enable signal is in the asserted state;

a latch having an input coupled to the mute node whereby said latch stores the state of the mute node when the detect_enable is in the asserted state;

a logic gate comprising:
a first input coupled to receive an inverted output from said latch;
a second input coupled to receive the detect_enable signal; and
an output which is in a high state when the first input and the second input are in the same state and is in a low state when the first input and the second input are in opposite states;

said inverted latch output and said logic gate output being coupled to respective first and second inputs of a mute driver circuit whereby an output of the mute driver circuit enables the mute node with the proper signal polarity when the mute_control signal is in the asserted state.

23. The mute polarity detector of claim 22, wherein said inverted latch output and said logic gate output are coupled to the respective first and second inputs of the mute driver circuit through a non-overlap driver circuit.

* * * * *